(12) United States Patent
Bernstein et al.

(10) Patent No.: US 8,686,559 B2
(45) Date of Patent: Apr. 1, 2014

(54) SEMICONDUCTOR CHIP STACKING FOR REDUNDANCY AND YIELD IMPROVEMENT

(75) Inventors: Kerry Bernstein, Underhill, VT (US); Philip G. Emma, Danbury, CT (US); Michael Ignatowski, Red Hook, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/607,680

(22) Filed: Sep. 8, 2012

(65) Prior Publication Data

US 2012/0326333 A1 Dec. 27, 2012

Related U.S. Application Data

(62) Division of application No. 12/041,878, filed on Mar. 4, 2008.

(51) Int. Cl.
*H01L 23/34* (2006.01)

(52) U.S. Cl.
USPC .............. 257/723; 257/686; 257/E21.526; 365/185.09

(58) Field of Classification Search
USPC .............. 257/750–786, 723, 686, E21.526; 365/185.09
See application file for complete search history.

(56) References Cited

U.S. PATENT DOCUMENTS

| | | | |
|---|---|---|---|
| 6,812,557 B2 | 11/2004 | Matsuo et al. | |
| 2003/0057564 A1 | 3/2003 | Leedy | |
| 2003/0193076 A1 | 10/2003 | Patti | |
| 2004/0129939 A1 | 7/2004 | Matsuo et al. | |
| 2005/0127490 A1 | 6/2005 | Black et al. | |
| 2006/0001176 A1 | 1/2006 | Fukaishi et al. | |
| 2008/0215802 A1 | 9/2008 | Chow et al. | |
| 2008/0229026 A1 | 9/2008 | Chung | |
| 2009/0015322 A1 | 1/2009 | Flautner et al. | |
| 2009/0085217 A1 | 4/2009 | Knickerbocker et al. | |
| 2009/0115042 A1 | 5/2009 | Koyanagi | |
| 2009/0172288 A1 | 7/2009 | Sukegawa | |

FOREIGN PATENT DOCUMENTS

WO 2005119776 A1 12/2005

OTHER PUBLICATIONS http://www.physorg.com/news96826756.html.

*Primary Examiner* — H. Jey Tsai
(74) *Attorney, Agent, or Firm* — Scully, Scott, Murphy & Presser, P.C.; Vazken Alexanian

(57) ABSTRACT

A stacked semiconductor chip comprising multiple unit chips contains multiple instances of a first chip component that have a low yield and are distributed among the multiple unit chips. An instance of the first chip component within a first unit chip is logically paired with at least another instance of the first chip component within at least another unit chip so that the combination of the multiple instances of the first chip component across the multiple unit chips constitute a functional block providing the functionality of a fully functional instance of the first chip component. The stacked semiconductor chip may include multiple instances of a second chip component having a high yield and distributed across the multiple unit chips. Multiple low yield components constitute a functional block providing an enhanced overall yield, while high yield components are utilized to their full potential functionality.

15 Claims, 5 Drawing Sheets

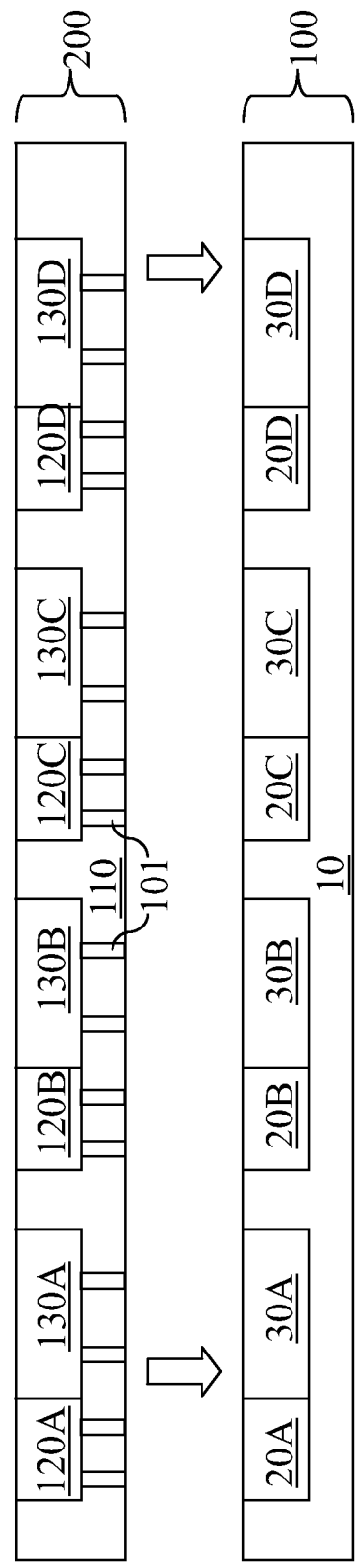
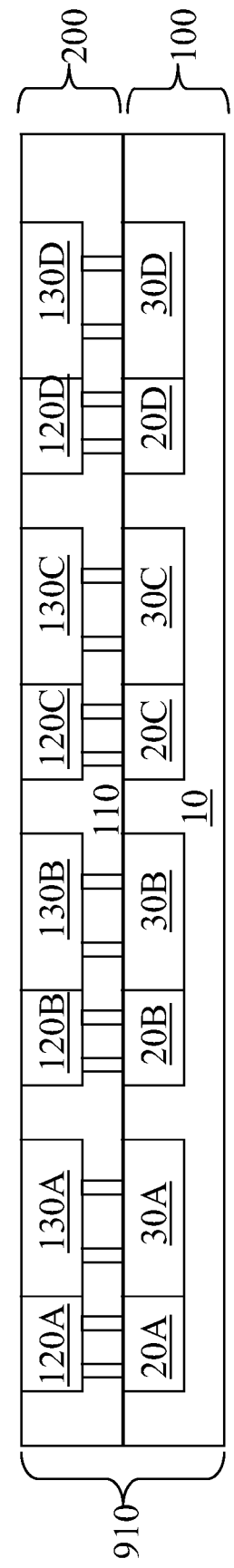
FIG. 1A
FIG. 1B

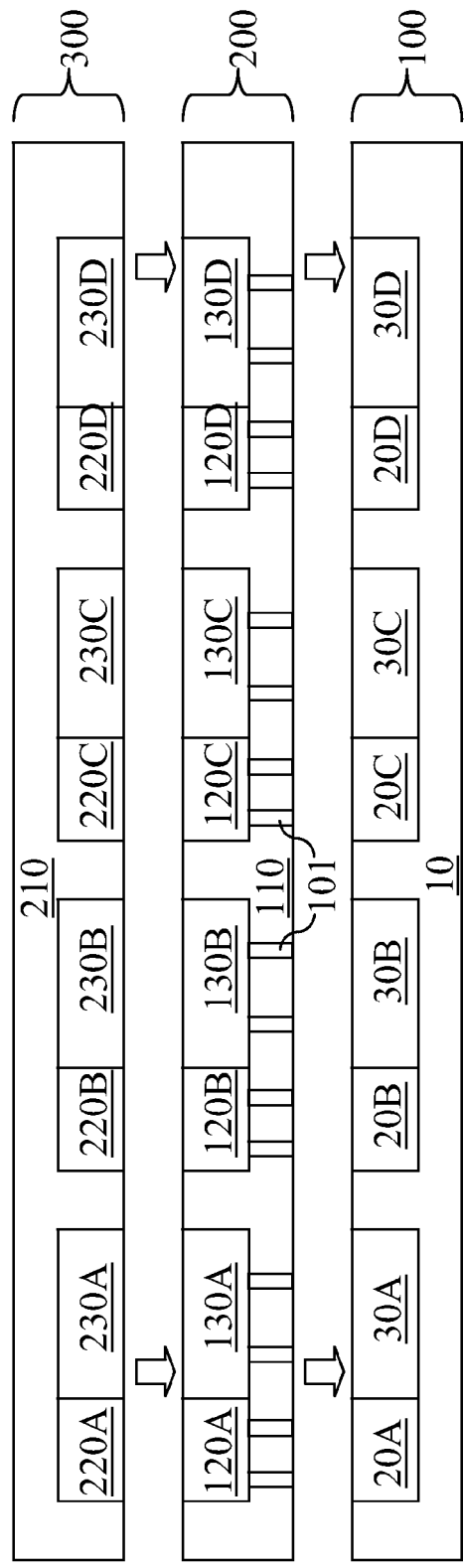
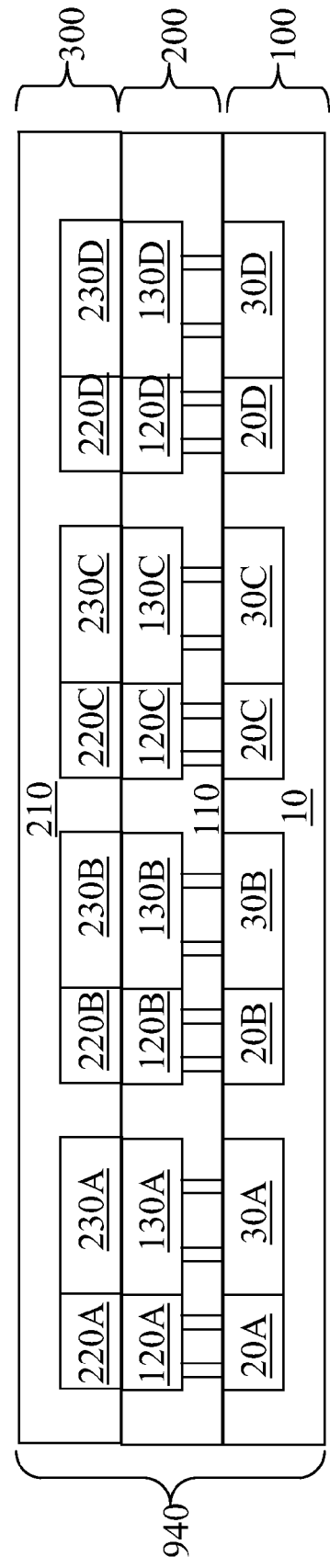
FIG. 4A
FIG. 4B

SEMICONDUCTOR CHIP STACKING FOR REDUNDANCY AND YIELD IMPROVEMENT

CROSS REFERENCE TO RELATED APPLICATION

This application is a divisional of U.S. patent application Ser. No. 12/041,878, filed Mar. 4, 2008 the entire content and disclosure of which is incorporated herein by reference.

FIELD OF THE INVENTION

The present invention generally relates to semiconductor structures, and particularly to a stacked semiconductor chip providing redundancy in functionality and improvement in yield and methods of manufacturing the same.

BACKGROUND

Chip yield, which is the fraction of functional chips among all manufactured chips, is a key factor in determining chip cost. From a manufacturing point of view, per-wafer production cost of semiconductor chips cannot be lowered below a certain level. Since the total production cost must be recouped from the sale of functional chips, a low chip yield invariably drives up the unit cost of the chip.

State-of-the-art semiconductor chips that provide superior performance often run into a high production cost due to low chip yield. This is because state-of-the-art semiconductor chips, in order to deliver superior performance than more common economical chips, tend to utilize a large chip area as well as aggressively scaled lithographic dimensions and processing techniques that have not fully matured or stabilized. Thus, the more aggressive the unit process technology employed in manufacturing a chip, and the larger the area of the chip, the lower the chip yield and the higher the cost of the chip.

In order to improve chip yield, redundancy repair components are often fabricated on a chip. This is almost universally done for array structures such as dynamic random access memory (DRAM) arrays and static random access memory (SRAM) arrays. Incorporation of redundant rows or redundant columns is easy to implement in an array structure.

For logic blocks, redundancy is much harder to implement since components of logic blocks are much less repetitive. Prediction of a high failure rate area is mostly a futile exercise since most of the logic block components have insignificant failure rates. Thus, building redundancy for logic blocks is much less effective than for an array structure, as well as requiring much more area than redundancy repair components for the array structure. In other words, the area penalty associated with building redundancy repair components for logic blocks is unacceptably high.

Normal chips containing multiple processor cores on a semiconductor substrate could include extra processor cores for redundancy repair to improve yield. However, the total area of the extra processor core including the areas of caches and bus interconnect logic circuits is substantial for each extra processor core. Further, considering that the caches and the bus interconnect logic circuits typically have a high yield, the areas occupied by the caches and the bus interconnect logic circuits are wasted area that typically does not contribute to improved yield yet increases the total chip area.

Further, design requirements typically call for a number of processor cores that is a power of two, i.e., 2, 4, 8, etc., which typically fits into natural floor planning pattern for chips. Adding extra processor cores for redundancy repair generally breaks this natural floor planning pattern. For these reasons, addition of extra processor cores into a semiconductor chip is, in general, problematic.

However, providing a mechanism for repairing a chip has grown in importance since the number of processor cores per chip continues to increase. "All good chips" in which all processor cores are functional becomes more challenging with the increase in the number of processor cores.

In view of the above, there exists a need to provide improved yield to a semiconductor chip having multiple processor cores.

Specifically, there exists a need to provide a structure having a repair capability to semiconductor chips having multiple processor cores and methods of manufacturing the same.

SUMMARY

The present invention addresses the needs described above by providing a stacked semiconductor chip in which processor cores are distributed among multiple semiconductor chips and provides redundancy amongst them, and methods of manufacturing the same.

In the present invention, a stacked semiconductor chip comprising multiple unit chips contains multiple instances of a first chip component that have a low yield and are distributed among the multiple unit chips. An instance of the first chip component within a first unit chip is logically paired with at least another instance of the first chip component within at least another unit chip so that the combination of the multiple instances of the first chip component across the multiple unit chips constitute a functional block providing the functionality of a fully functional instance of the first chip component. The stacked semiconductor chip may include multiple instances of a second chip component having a high yield and distributed across the multiple unit chips. The stacked semiconductor chip may be designed to employ all, or most, of the instances of the second chip component across the multiple unit chips. Thus, multiple low yield components constitute a functional block providing an enhanced overall yield, while high yield components are utilized to their full potential functionality.

According to an aspect of the present invention, a stacked semiconductor chip is provided, which comprises:

a first unit chip containing a first instance of a chip component; and a second unit chip containing a second instance of the chip component, wherein the first instance and the second instance are logically connected to form a functional block that provides functionality of a fully functional instance of the chip component.

In one embodiment, the chip component is a processor core, an execution unit of a processor core, or a functional logic unit of a semiconductor chip.

According to another aspect of the present invention, another stacked semiconductor chip is provided, which comprises:

a first unit chip containing a first group of instances of a chip component; and a second unit chip containing a second group of instances of the chip component, wherein each of the first group of instances is logically connected with one of the second group of instances to from a functional block that provides functionality of a fully functional instance of the chip component.

In one embodiment, the number of instances in the first group and the number of instances in the second group are the same.

In another embodiment, the first unit chip and the second unit chip have substantially the same design layout, and wherein each of the functional block comprises a set of through-vias within a substrate of the second unit chip that provides electrical connection between an instance of the chip component in the first unit chip and another instance of the chip component in the second unit chip.

In even another embodiment, a design layout of the second unit chip is substantially a mirror image of the first unit chip, and wherein each of the functional block comprises:

an instance of the chip component in the first unit chip;

another instance of the chip component in the second unit chip and overlies the instance of the chip component in the first unit chip;

a first metal interconnect structure located in the first unit chip; and a second metal interconnect structure located in the second unit chip and directly contacting the first metal contact.

In yet another embodiment, the stacked semiconductor chip further comprises another functional block, the functional block comprising:

a first instance of another chip component located in the first unit chip; and a second instance of the another chip component located in the second unit chip, wherein functionality of the another functional block is enhanced over functionality of a fully functional instance of the another chip component.

In still another embodiment, the functionality of the functional block is substantially equal to twice the functionality of the one instance of the another chip component.

In even another aspect of the present invention, an even another stacked semiconductor chip is provided which comprises a plurality of unit chips, each containing at least one instance of a chip component, wherein multiple instances of the chip components are logically connected across the plurality of the unit chips to form a functional block that provides functionality of a fully functional instance of the chip component.

In one embodiment, the plurality of unit chips comprises at least three unit chips that are vertically stacked.

In another embodiment, the stacked semiconductor chip further comprises another functional block comprising a plurality of instances of another chip component located in each of the plurality of unit chips, wherein functionality of the another functional block is enhanced over functionality of a fully functional instance of the another chip component.

According to still another aspect of the present invention, a method of forming a stacked semiconductor chip is provided, which comprises:

providing a first unit chip containing a first instance of a chip component;

providing a second unit chip containing a second instance of the chip component; and forming a logically connected functional block containing the first instance and the second instance by stacking the first unit and the second unit, wherein the logically connected functional block provides functionality of a fully functional instance of the chip component.

In one embodiment, the method further comprises forming another functional block containing:

a first instance of another chip component located in the first unit chip; and a second instance of the another chip component located in the second unit chip, wherein functionality of the another functional block is enhanced over functionality of a fully functional instance of the another chip component.

In another embodiment, the method further comprises:

providing at least another unit chip, wherein each of the at least another unit chip contains another instance of the chip component; and stacking the at least another unit chip with the first and the second unit, wherein the logically connected functional block further contains the another instance of the chip component in each of the at least another unit chip.

BRIEF DESCRIPTION OF THE DRAWINGS

FIGS. 1A-1B are sequential cross-sectional views illustrating formation of a first exemplary stacked semiconductor chip according to a first embodiment of the present invention.

FIGS. 4A-4B are sequential cross-sectional views illustrating formation of a fourth exemplary stacked semiconductor chip according to a fourth embodiment of the present invention.

DETAILED DESCRIPTION

Figure 2A:
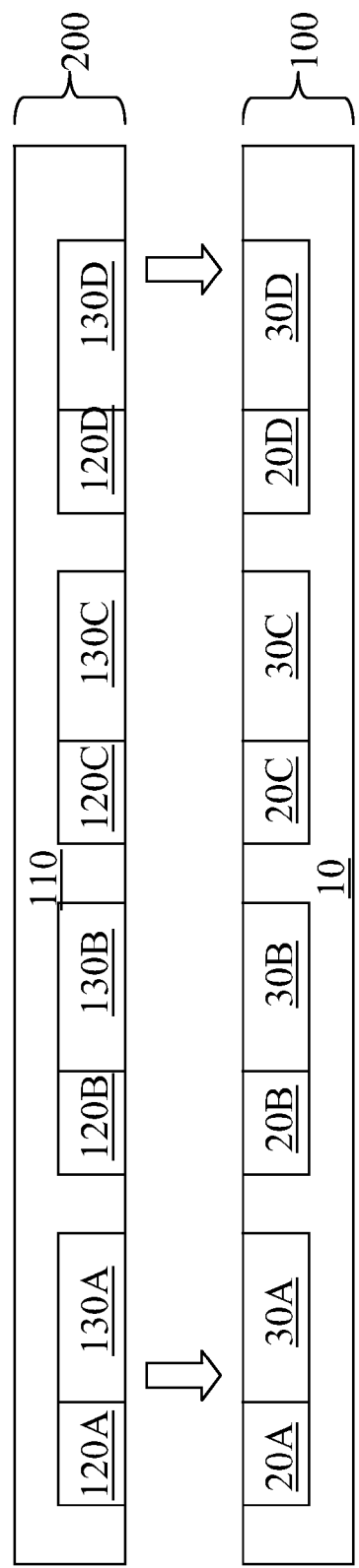
FIGS. 2A-2B are sequential cross-sectional views illustrating formation of a second exemplary stacked semiconductor chip according to a second embodiment of the present invention.

As stated above, the present invention relates to a stacked semiconductor chip providing redundancy in functionality and improvement in yield and methods of manufacturing the same, which are now described in detail with accompanying figures. It is noted that like and corresponding elements are referred to by like reference numerals.

While the present invention is described with exemplary semiconductor structures containing four instances of one type of chip component within a unit chip, the number of instances may be any positive integer. Variations corresponding to different numbers of instances of various chip components are explicitly contemplated herein.

Referring to FIG. 1A, a first exemplary semiconductor structure according to a first embodiment of the present invention comprises a first unit chip 100 comprising a semiconductor substrate 10 and a second unit chip 200 comprising another semiconductor substrate 110. The first unit chip 100 comprises at least one instance of a first chip component and at least one instance of a second chip component. Each unit chip comprises one layer of a semiconductor substrate.

Specifically, the first unit chip 100 comprises a first instance of the first chip component 20A, a second instance of the first chip component 20B, a third instance of the first chip component 20C, and a fourth instance of the first chip component 20D. The first unit chip 100 also comprises a first instance of the second chip component 30A, a second instance of the second chip component 30B, a third instance of the second chip component 30C, and a fourth instance of the fourth chip component 30D. In the same manner, the second unit chip 200 comprises fifth through eighth instances of the first chip component (120A-120D) and fifth through eighth instances of the second chip component (130A-130D).

The first chip component is a chip component on which a low yield is expected or observed. While the term "low yield" is relative and may mean any number from above 0 to about 0.99 depending on economics of chip manufacturing, it is understood that economic considerations determine a threshold level for the term "low yield." If a semiconductor chip contains many instances of the first chip component and if functionality of all instances of the first chip component is required for operation of the semiconductor chip, the threshold level for the "low yield" may be above 0.90. If a semiconductor chip contains only one instance of the first chip component, the threshold level for the "low yield" may be about 0.2. In general, if the yield of the first chip component is a primary parameter and improvement in the yield of the first chip component may materially improve profitability of the semiconductor chip manufacturing operation, such a yield level may be considered low.

Typically, logic components tend to have a low yield due to lack of suitable redundancy repair circuitry. Non-limiting exemplary first chip components may include a processor core and an execution unit of a processor core. Any other logic circuit or device having a low yield may be employed as a first chip component. The first chip component may be a collection of multiple logic circuits having a low yield.

The second chip component is a chip component on which a high yield is expected or observed. The term "high yield" is the opposite of the term "low yield". It is understood that economic considerations determine a threshold level for the term "high yield." In general, if the yield of the second chip component is sufficiently high so that improvement or degradation in the yield of the second chip component does not materially improve profitability of the semiconductor chip manufacturing operation, such a yield level may be considered high. It is noted that determination as to whether a chip component has a high yield or a low yield is determined in relation to the impact of the yield levels of other chip components. For example, if the profitability of a chip manufacturing operation is significantly impacted by the yield of a chip component, while not substantially being impacted by another chip component, the chip component that significantly affects the profitability of the chip manufacturing operation has a "low yield," while the chip component that does not substantially impact the profitability has a "high yield."

Typically, array structures tend to have a high yield due to an efficient redundancy repair circuitry. Non-limiting exemplary second chip components may include a dynamic random access memory (DRAM) array, a static random access memory (SRAM), a cache memory array, a non-volatile memory array, a power supply bus, a ground bus, a built-in-self-test (BIST) circuit, a memory controller, an input/output control circuit, and a signal bus. Any other logic circuit, memory circuit, or device having a high yield may be employed as a second chip component. The second chip component may be a combination of circuit elements having a high yield.

The first unit chip 100 and the second unit chip 200 may, or may not, have substantially the same design layout. Preferably, the first unit chip 100 and the second unit chip 200 have substantially the same design layout. The first unit chip 100 and the second unit chip 200 may have the same layout for the instances of the first chip component and the instances of the second chip component. A set of through-vias 101 are formed in the substrate 110 by forming through-trenches and filling them with a conductive material such as doped polysilicon or a metallic material. Methods of forming through-vias are known in the art. The set of through vias 101 are formed underneath each of the fifth through eighth instances of the first chip component (120A-120D) and each of the fifth through eighth instances of the second chip component (130A-130D).

Referring to FIG. 1B, the first unit chip 100 and the second unit chip 200 are brought into intimate contact with each other, face to back, and vertically bonded to form a stacked semiconductor chip 920. Methods of bonding two unit chips are known in the art. In case the first unit chip 100 and the second unit chip 200 have substantially the same design layout, the set of through-vias 101 electrically connect the first instance of the first chip component 20A with the fifth instance of the first chip component 120A, the second instance of the first chip component 20B with the sixth instance of the first chip component 120B, etc. Also, the set of through-vias 101 electrically connect the first instance of the second chip component 30A with the fifth instance of the second chip component 130A, the second instance of the second chip component 30B with the sixth instance of the second chip component 130B, etc.

Each pair of electrically connected instances of the first chip component constitutes a functional block of the first chip component. Specifically, the first instance of the first chip component 20A and the fifth instance of the first chip component 120A constitute a first functional block of the first chip component, the second instance of the first chip component 20B and the sixth instance of the first chip component 120B constitute a second functional block of the first chip component, etc.

Each functional block of the first chip component provides functionality of the first chip component. In each functional block of the first chip component, two instances of the first chip component may be functional, only one of the two instances of the first chip component may be functional, or none of the two instances of the first chip component may be functional. A selection circuit (not shown) in one of the two unit chips (100 and 200) selects which instance of the two instances of the first chip component to activate. In case only one of the two instances of the first chip component is functional, the selection circuit selects the functional instance of the two instances. In case both of the two instances of the first chip component are functional, the selection circuit may randomly select one of the two instances, or may compare performance of the two instances and select the one with higher performance. Also, the selection circuit may program a non-volatile memory to "tag" the functional block as one having a redundancy capability so that the selection circuit may switch activate the unselected instance in case the selected instance fails during operation. If at least one instance within a functional block of the first chip component is functional, the functional block of the first chip component provides functionality of a fully functional first chip component.

A functional block of the first chip components provides a higher yield than an instance of the first chip component. Since the yield of instances of the first chip component is low, i.e., materially affects profitability of the chip manufacturing operation, the higher yield of the functional block may improve profitability of the chip manufacturing operation significantly. This is particularly so when the semiconductor chip contains a large number of first chip components that need to be functional in order for the semiconductor chip as a whole to be functional. In this case, an overall yield increase, even after considering the reduction in total die count by 50%, may be obtained by substituting a functional block having two instances of the first chip component contained in the inventive stacked semiconductor chip for a single instance of the first chip component in a normal semiconductor chip that is not stacked and, consequently, having no built-in redundancy for the instance of the first chip component.

Each pair of electrically connected instances of the second chip component constitutes a functional block of the second chip component. Specifically, the first instance of the second chip component 30A and the fifth instance of the second chip component 130A constitute a first functional block of the second chip component, the second instance of the second chip component 30B and the sixth instance of the second chip component 130B constitute a second functional block of the first chip component, etc.

Each functional block of the second chip component utilizes all available functionality of the pair of instances of the second chip component. The instances of the second chip components have a high yield, i.e., the yield level of the instances of the second chip components is sufficiently high so that the profitability of the chip manufacturing operation is not substantially affected to the yield of the instances of the second chip component. Thus, the individual instances of the second chip component are expected to yield.

Further, the second chip components may be an array structure having built-in redundancy repair circuits. In such a case, even if the array structure may not be fully repairable, the array structure is often partially repairable. By utilizing functionality of both instances of the second chip component, a functional block may have functionality that is enhanced over the functionality of one fully functional instance of the second chip component. The second chip component may be a power supply bus or a ground bus, in which case the presence of a set of duplicate power supply bus or a set of duplicate ground bus provides enhanced functionality due to overall lower resistance of the bus system.

A control circuit (not shown) in one of the two unit chips (100 and 200) determines total available functionality of the two instances of the second chip component. For example, if the second chip component is an embedded dynamic random access memory (eDRAM) structure having 32 MB of capacity and one of the two instances of the second chip component in the functional block has 32 MB of capacity and the other has 31 MB of capacity, the control circuit may activate all available memory capacity, i.e., a total of 63 MB. Since all available functionality is activated and instances of the second chip element are expected to have a high yield, the functional block has functionality that is enhanced over the functionality of a fully functional instance of the second chip element. The control unit may track available functionality of the functional block of the second chip element during operation of the stacked semiconductor chip 910 and adjust the functionality of the functional block of the second chip element if a portion of the functional block fails for any reason.

Thus, the stacked semiconductor chip 910 provides functional blocks of the first chip component that have an enhanced yield in lieu of a low yielding instance of the first chip component. When high yielding instances of the second chip component are available, the stacked semiconductor chip 910 utilizes all or most of the instances of the second chip component across the first unit chip 100 and the second unit chip 200. The functionality of the functional blocks of the second chip component is enhanced over the functionality of a fully functional instance of the second chip component. All functioning instances of the second chip component may be utilized to their full potential functionality. Overall area utilization of the semiconductor chip area is maximized according to the present invention.

Referring to FIG. 2A, a second exemplary semiconductor structure according to a second embodiment of the present invention comprises a first unit chip 100 comprising a semiconductor substrate 10 and a second unit chip 200 comprising another semiconductor substrate 110 as in the first embodiment. The first unit chip 100 comprises first through fourth instances of the first chip component (20A-20D) and first through fourth instances of the second chip component (30A-30D) as in the first embodiment. In the same manner, the second unit chip 200 comprises fifth through eighth instances of the first chip component (120A-120D) and fifth through eighth instances of the second chip component (130A-130D).

The characteristics of the first chip component and the second chip component are the same as in the first embodiment. Particularly, the first chip component is a "low yield" chip component, while the second chip component is a "high yield" chip component as in the first embodiment. The design layout of the first unit chip 100 and the design layout of the second unit chip 200 may, or may not, substantially be mirror images of each other. Preferably, the design layout of the first unit chip 100 and the design layout of the second unit chip 200 are substantially mirror images of each other.

The first unit chip 100 comprises a first metal interconnect structure (not shown separately) that is distributed among, and incorporated within, the various components of the first unit chip 100. Specifically, the first metal interconnect structure is distributed among the first through fourth instances of the first chip component (20A-20D) and first through fourth instances of the second chip component (30A-30D). Likewise, the second unit chip 200 comprises a second metal interconnect structure (not shown separately) that is distributed among, and incorporated within, the fifth through eighth instances of the first chip component (120A-210D) and fifth through eighth instances of the second chip component (130A-130D).

Figure 2B:
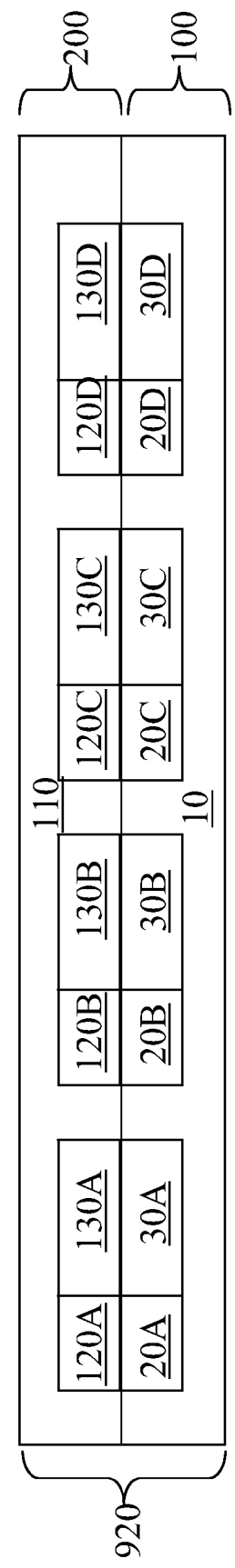

Referring to FIG. 2B, the first unit chip 100 and the second unit chip 200 are brought into intimate contact with each other, face to face, and vertically bonded to form a stacked semiconductor chip 920. Methods of bonding two unit chips face to face are known in the art. The first metal interconnect structure directly contacts the second metal interconnect structure. In case the design layout of the first unit chip 100 and the design layout of the second unit chip 200 are substantially mirror images of each other, the first through fourth instances of the first chip component (20A-20D) directly face fifth through eighth instances of the first chip component (120A-120D), respectively. Similarly, the fifth through fourth instances of the second chip component (30A-30D) directly face fifth through eighth instances of the second chip component (130A-130D), respectively. A pair of instances that face directly each other is electrically connected to form a functional block. In case the design layout of the first unit chip 100 and the design layout of the second unit chip 200 are not substantially mirror images of each other, the wiring of the first metal interconnect structure or the second metal interconnect structure may be tailored to provide electrical connection between pairs of instances of the first chip component and between pairs of instances of the second chip component.

Each pair of electrically connected instances of the first chip component constitutes a functional block of the first chip component. Specifically, the first instance of the first chip component 20A and the fifth instance of the first chip component 120A constitute a first functional block of the first chip component, the second instance of the first chip component 20B and the sixth instance of the first chip component 120B constitute a second functional block of the first chip component, etc.

As in the first embodiment, each pair of electrically connected instances of the first chip component constitutes a functional block of the first chip component that provides functionality of a fully functional first chip component as long as one of the two instances of the first chip component is functional by selecting a functional instance of the first chip component. A functional block of the first chip components provides a higher yield than an instance of the first chip component. An overall yield increase may be obtained as in the first embodiment.

As in the first embodiment, each pair of electrically connected instances of the second chip component constitutes a functional block of the second chip component. Each functional block of the second chip component utilizes all available functionality of the pair of instances of the second chip component. A control circuit (not shown) in one of the two unit chips (100, 200) determines total available functionality of the two instances of the second chip component. The control unit may track available functionality of the functional block of the second chip element during operation of the stacked semiconductor chip 920 and adjust the functionality of the functional block of the second chip element if a portion of the functional block fails for any reason.

As in the first embodiment, all functioning instances of the second chip component may be utilized to their full potential functionality. Overall area utilization of the semiconductor chip area is maximized according to the present invention.

Figure 3A:
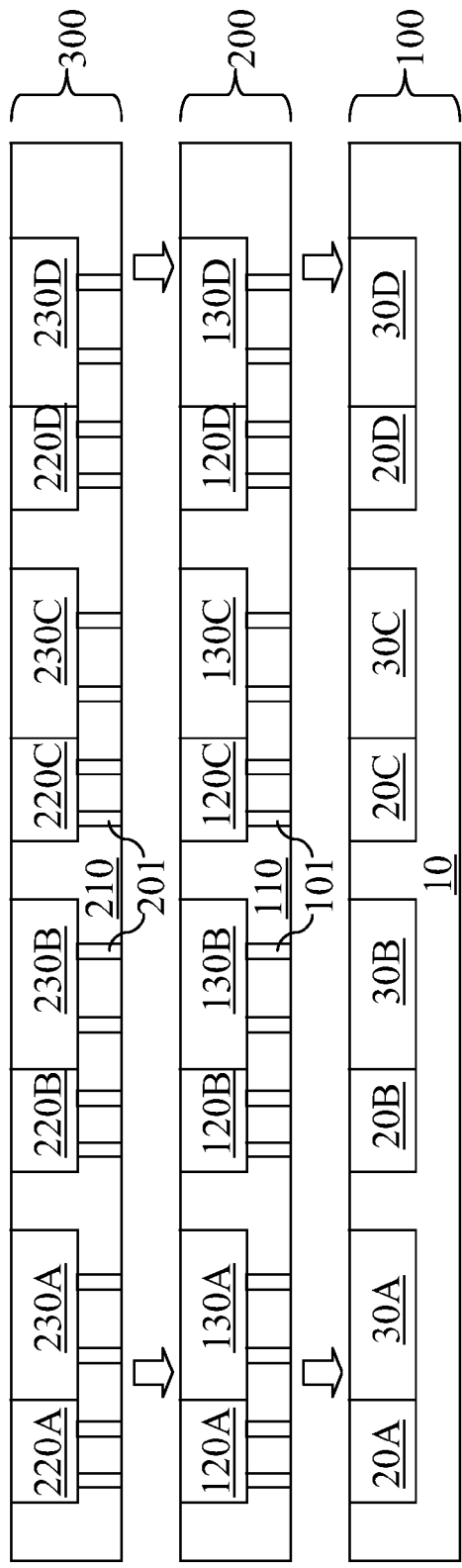
FIGS. 3A-3B are sequential cross-sectional views illustrating formation of a third exemplary stacked semiconductor chip according to a third embodiment of the present invention.

Referring to FIG. 3A, a third exemplary semiconductor structure according to a third embodiment of the present invention comprises a first unit chip 100 comprising a semiconductor substrate 10, a second unit chip 200 comprising another semiconductor substrate 110, and a third unit chip 300 comprising yet another semiconductor substrate 210. The first unit chip comprises first through fourth instances of the first chip component (20A-20D) and first through fourth instances of the second chip component (30A-30D) as in the first embodiment. The second unit chip 200 comprises fifth through eighth instances of the first chip component (120A-120D) and fifth through eighth instances of the second chip component (130A-130D) as in the first embodiment. The third unit chip 300 comprises ninth through twelfth instances of the first chip component (220A-220D) and ninth through twelfth instances of the second chip component (230A-230D).

While the present invention is described with three unit chips (100, 200, 300), extension of the present invention to a multiple unit chips of an arbitrary positive integer number greater than 3 is straightforward, and is explicitly contemplated herein.

The characteristics of the first chip component and the second chip component are the same as in the first embodiment. The design layouts of the first unit chip 100, the second unit chip 200, and the third unit chip 300 may, or may not, substantially be substantially the same. Preferably, the design layouts of the first unit chip 100, the second unit chip 200, and the third unit chip 300 are substantially the same. The second unit chip 200 comprises a set of through-vias 101, and the third unit chip 300 comprises another set of through-vias 201.

Figure 3B:
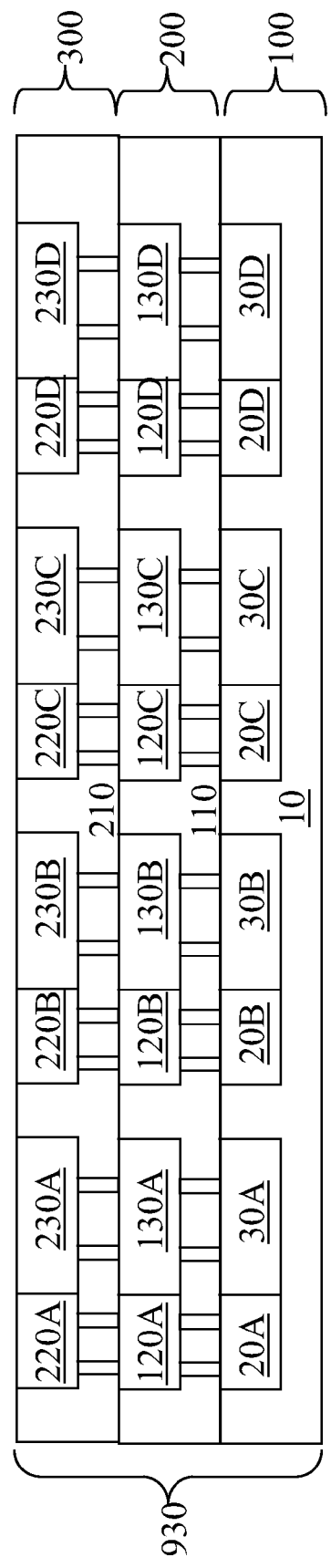

Referring to FIG. 3B, the first unit chip 100, the second unit chip 200, and the third unit chip 300 are brought into intimate contact, face to back between adjoining unit chips, and vertically bonded to form a stacked semiconductor chip 930. Methods of bonding two unit chips face to back are repetitively employed to form the third exemplary semiconductor structure. In case the design layouts of the first unit chip 100, the second chip 200, and the third chip 300 are substantially the same, instances of the first chip component adjoined by the various through-vias (101, 201) are stacked one on top of another. A group of instances that are directly adjoined by the through-vias (101, 202) and electrically connected amongst one another forms a functional block. In case the design layouts of the first unit chip 100, the second unit chip 200, and the third unit chip 300 are not substantially the same, the wiring within the first unit chip 100 and/or the wiring of the second unit chip 200 may be tailored to provide electrical connection between a group of instances of the first chip component and between a group of instances of the second chip component such that each group contains one instance of the first chip component or the second chip component per unit chip (100, 200, or 300).

Each group of electrically connected instances of the first chip component constitutes a functional block of the first chip component. Specifically, the first instance of the first chip component 20A, the fifth instance of the first chip component 120A, and the ninth instance of the first chip component constitute a first functional block of the first chip component; the second instance of the first chip component 20B, the sixth instance of the first chip component 120B, and the tenth instance of the first chip component 220B constitute a second functional block of the first chip component, etc.

Each group of electrically connected instances of the first chip component constitutes a functional block of the first chip component that provides functionality of a fully functional first chip component as long as one of the instances of the first chip component in the group is functional. A functional instance of the first chip component is selected during in-line testing, package level testing, or during operation of the stacked semiconductor chip 930. A functional block of the first chip components provides a higher yield than an instance of the first chip component. An overall yield increase may be obtained as in the first and second embodiment.

Each group of electrically connected instances of the second chip component constitutes a functional block of the second chip component. Each functional block of the second chip component utilizes all available functionality of the pair of instances of the second chip component. A control circuit (not shown) in one of the three unit chips (100, 200, 300) determines total available functionality of the three instances of the second chip component. The control unit may track available functionality of the functional block of the second chip element during operation of the stacked semiconductor chip 930 and adjust the functionality of the functional block of the second chip element if a portion of the functional block fails for any reason.

As in the first and second embodiment, all functioning instances of the second chip component are utilized to their full potential functionality. Overall area utilization of the semiconductor chip area may be maximized according to the present invention.

Referring to FIGS. 4A and 4B, a fourth exemplary semiconductor structure according to a fourth embodiment of the present invention comprises a first unit chip 100 comprising a semiconductor substrate 10, a second unit chip 200 comprising another semiconductor substrate 110, and a third unit chip 300 comprising yet another semiconductor substrate 210 as in the third embodiment. Front to front chip bonding and front to back chip bonding may be employed in forming the stacked semiconductor chip 940 of the fourth embodiment instead of font to back bonding of the third embodiment. A group of instances that are electrically connected by a set of through-vias 101 and metal interconnect structures (not shown) in the various unit chips (100, 200, 300) forms a functional block.

Each group of electrically connected instances of the first chip component constitutes a functional block of the first chip component as in the third embodiment. Each group of electrically connected instances of the first chip component constitutes a functional block of the first chip component that provides functionality of a fully functional first chip component as long as one of the instances of the first chip component in the group is functional. A selection circuit may be employed to select a functioning instance among the group of instances in the same functional block of the first chip component. An overall yield increase may be obtained as in the third embodiment.

Each group of electrically connected instances of the second chip component constitutes a functional block of the second chip component. Each functional block of the second chip component utilizes all available functionality of the pair of instances of the second chip component. A control circuit may be employed as in the third embodiment. All functioning instances of the second chip component may be utilized to their full potential functionality.

Figure 5:
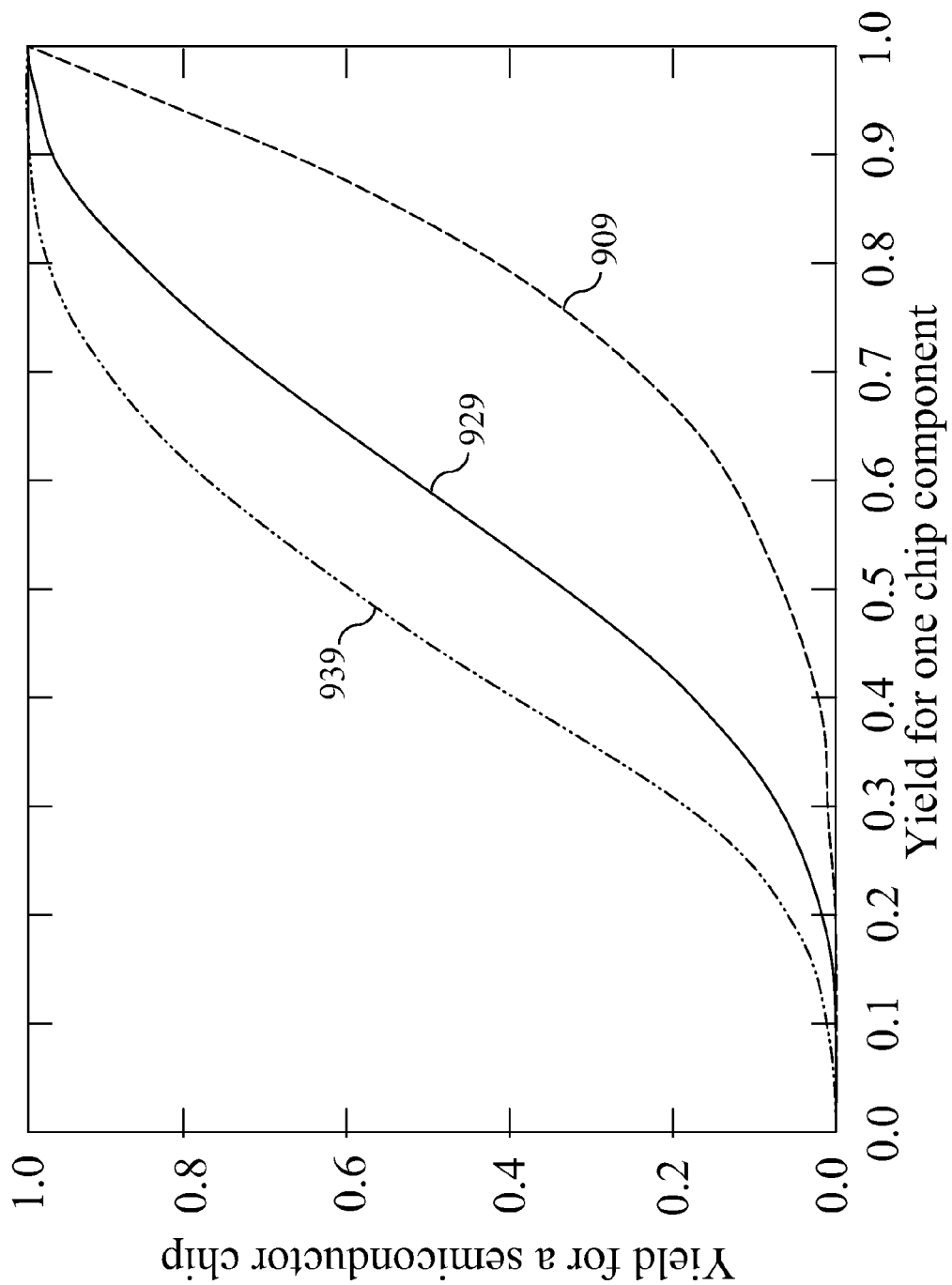
FIG. 5 is a plot showing yield curves for a normal chip comprising four chip components, an inventive stacked semiconductor chip comprising four pairs of chip components, and another inventive stacked semiconductor chip comprising four triplets of chip components, wherein functionality of four chip components is required for render a chip functional, as a function of yield for one chip component.

Referring to FIG. 5, a first yield curve 909, a second yield curve 929, and a third yield curve 939 are shown as a function of the yield for one chip component Ycc as an exemplary demonstration of the utility of the present invention. A design for a semiconductor chip contains four instances of a chip component, and requires functionality of all four instances of the chip component. The first yield curve 909 is a chip yield curve for a normal chip containing four instances of the chip components formed on the same semiconductor substrate. The first yield is equal to the yield for one chip component Ycc raised to the fourth power since all four instances of the chip component needs to be functional for the normal chip to be functional, i.e., $Ycc^4$. The second yield curve 929 is a chip yield curve of an inventive stacked semiconductor chip according to a first or second embodiment of the present invention and comprising four pairs of instances of the chip component, or four functional blocks of the chip component. For each of a functional block to be non-functional, all of the instances in the functional block need to be non-functional. The probability of one functional block of the chip component to be functional is given by $1-(1-Ycc)^2$. The chip yield of the inventive stacked semiconductor chip in this case is given by $\{1-(1-Ycc)^2\}^4$. The third yield curve 939 is a chip yield curve of an inventive stacked semiconductor chip according to a third or fourth embodiment of the present invention and comprising four groups of instances of the chip component, or four blocks of the first chip component. For each of a functional block to be non-functional, all of the instances in the functional block need to be non-functional. The probability of one functional block of the chip component to be functional is given by $1-(1-Ycc)^3$. The chip yield of the inventive stacked semiconductor chip in this case is given by $\{1-(1-Ycc)^3\}^4$. Stacking of unit chips and formation of block components providing the functionality of a chip component at a higher yield than an isolated chip component may provide a higher chip yield in some cases even after factoring in reduction of the total semiconductor chip count associated with stacking. In other words, even after utilizing multiple unit chips to form a stacked semiconductor chip, overall count of functional semiconductor chip may be higher if unit chips are stacked with mutual repair redundancy.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A stacked semiconductor chip comprising:
a first unit chip containing a first instance of a first chip component, and a first instance of a second chip component;
a second unit chip containing a second instance of said first chip component, and a second instance of said second chip component, wherein said first instances and said second instances are logically connected to form a functional block that provides functionality of a fully functional instance of said first and second chip components; and
a control circuit located in one of said first and second unit chips that determines, and activates, total available functionality of said first and second instances of the second chip component, wherein said total available functionality is enhanced over functionally of a fully functional instance of said second chip component, and is less than twice said functionality of said fully functional instance of said second chip component.

2. The stacked semiconductor chip of claim 1, wherein at least one of said first chip component and said second chip component is a processor core, an execution unit of a processor core, or a functional logic unit of a semiconductor chip.

3. The stacked semiconductor chip of claim 1, wherein said first unit chip and said second unit chip have substantially the same design layout, and wherein said functional block comprises a set of through-vias within a substrate of said second unit chip that provides electrical connection between said first instances and said second instances.

4. The stacked semiconductor chip of claim 1, wherein a design layout of said second unit chip is substantially a mirror image of said first unit chip, wherein said second instances overlie said first instances, and wherein said functional block comprises:
a first metal interconnect structure located in said first unit chip; and
a second metal interconnect structure located in said second unit chip and directly contacting said first metal contact.

5. The stacked semiconductor chip of claim 1, further comprising another functional block, said functional block comprising:
a first instance of another chip component located in said first unit chip; and
a second instance of said another chip component located in said second unit chip, wherein functionality of said another functional block is enhanced over functionality of a fully functional instance of said another chip component.

6. A stacked semiconductor chip comprising:
a first unit chip containing a first group of instances of a chip component; and
a second unit chip containing a second group of instances of said chip component, wherein each of said first group of instances is logically connected with one of said second group of instances to form a functional block that provides functionality of a fully functional instance of said chip component; and
a control circuit located in one of said first and second unit chips that determines, and activates, total available functionality of said first and second group of instances, wherein said total available functionality is enhanced over the functionally of a fully functional group of instances of a chip component, and is less than twice said functionality of said fully functional group of instances of a chip component.

7. The stacked semiconductor chip of claim 6, wherein the number of instances in said first group and the number of instances in said second group are the same.

8. The stacked semiconductor chip of claim 6, wherein said first unit chip and said second unit chip have substantially the same design layout, and wherein each of said functional block comprises a set of through-vias within a substrate of said second unit chip that provides electrical connection between an instance of said chip component in said first unit chip and another instance of said chip component in said second unit chip.

9. The stacked semiconductor chip of claim 6, wherein a design layout of said second unit chip is substantially a mirror image of said first unit chip, and wherein each of said functional block comprises:
    an instance of said chip component in said first unit chip;
    another instance of said chip component in said second unit chip and overlies said instance of said chip component in said first unit chip;
    a first metal interconnect structure located in said first unit chip; and
    a second metal interconnect structure located in said second unit chip and directly contacting said first metal contact.

10. The stacked semiconductor chip of claim 6, further comprising another functional block, said functional block comprising:
    a first instance of another chip component located in said first unit chip; and
    a second instance of said another chip component located in said second unit chip, wherein functionality of said another functional block is enhanced over functionality of a fully functional instance of said another chip component.

11. The stacked semiconductor chip of claim 10, wherein said functionality of said functional block is substantially equal to twice the functionality of said one instance of said another chip component.

12. The stacked semiconductor chip of claim 10, wherein said another chip component is one of a dynamic random access memory (DRAM) array, a static random access memory (SRAM), a cache memory array, a non-volatile memory array, a power supply bus, a ground bus, a built-in-self-test (BIST) circuit, a memory controller, an input/output control circuit, and a signal bus.

13. A stacked semiconductor chip comprising a plurality of unit chips, each containing at least one instance of a chip component, wherein multiple instances of said chip components are logically connected across said plurality of said unit chips to form a functional block that provides functionality of a fully functional instance of said chip component; and
    a control circuit located in one of said plurality unit chips that determines, and activates, total available functionality of said multiple instances, wherein said total available functionality is enhanced over the functionally of a fully functional group of multiple instances of a chip component, and is less than twice said functionality of said fully functional group of multiple instances of a chip component.

14. The stacked semiconductor chip of claim 13, wherein said plurality of unit chips comprises at least three unit chips that are vertically stacked.

15. The stacked semiconductor chip of claim 13, further comprising another functional block comprising a plurality of instances of another chip component located in each of said plurality of unit chips, wherein functionality of said another functional block is enhanced over functionality of a fully functional instance of said another chip component.

* * * * *